US011251056B2

(12) United States Patent
Kang et al.

(10) Patent No.: US 11,251,056 B2
(45) Date of Patent: Feb. 15, 2022

(54) SUBSTRATE PROCESSING SYSTEM (71) Applicant: EUGENE TECHNOLOGY CO., LTD., Yongin-Si (KR)

(72) Inventors: Sung Ho Kang, Hwaseong-Si (KR); Chang Dol Kim, Yongin-Si (KR); Sang Young Oh, Hwaseong-Si (KR); Gyu Ho Choi, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 248 days.

(21) Appl. No.: 16/351,385

(22) Filed: Mar. 12, 2019

(65) Prior Publication Data
US 2019/0341278 A1 Nov. 7, 2019

(30) Foreign Application Priority Data
May 3, 2018 (KR) .................. 10-2018-0051460

(51) Int. Cl.
| | |
|---|---|
| *H01L 21/67* | (2006.01) |
| *H01L 21/677* | (2006.01) |
| *H01L 21/687* | (2006.01) |
| *F27B 1/24* | (2006.01) |
| *H01L 21/324* | (2006.01) |
| *H01J 37/32* | (2006.01) |

(52) U.S. Cl.
CPC ......... *H01L 21/67098* (2013.01); *F27B 1/24* (2013.01); *H01J 37/32779* (2013.01); *H01L 21/324* (2013.01); *H01L 21/67757* (2013.01); *H01L 21/68742* (2013.01)

(58) Field of Classification Search
CPC ......... C12C 16/45561; H01J 37/32779; H01L 21/67098; H01L 21/67757; H01L 21/68742; H01L 21/324; F27B 1/24
USPC ........................................ 118/719, 724–725
See application file for complete search history.

(56) References Cited

U.S. PATENT DOCUMENTS

| | | | | |
|---|---|---|---|---|
| 5,388,944 A | * | 2/1995 | Takanabe | ............ C23C 16/4401 |
| | | | | 118/719 |
| 5,407,350 A | * | 4/1995 | Iwabuchi | ................ C23C 16/54 |
| | | | | 432/11 |
| 5,464,313 A | * | 11/1995 | Ohsawa | .................. C23C 16/54 |
| | | | | 414/172 |

(Continued)

FOREIGN PATENT DOCUMENTS

| | | |
|---|---|---|
| JP | H01280312 A | 11/1989 |
| JP | H02138728 A | 5/1990 |

(Continued)

*Primary Examiner* — Charlee J. C. Bennett
(74) *Attorney, Agent, or Firm* — Renaissance IP Law Group LLP (57) ABSTRACT

A substrate processing system includes: first and second process tubes spaced apart from each other in a first axial direction to provide process spaces independent from each other; a substrate boat on which a plurality of substrates are multiply stacked and which is provided to each of process spaces of the first and second process tubes; and first and second boat elevation units provided to the first and second process tubes, respectively, to elevate the substrate boat, wherein each of the first and second boat elevation units includes an elevation shaft member disposed in a space between the first and second process tubes.

12 Claims, 6 Drawing Sheets

(56) References Cited

U.S. PATENT DOCUMENTS

| | | | | |
|---|---|---|---|---|
| 5,616,264 | A * | 4/1997 | Nishi | C30B 25/10 |
| | | | | 219/494 |
| 5,820,366 | A * | 10/1998 | Lee | C30B 25/08 |
| | | | | 432/241 |
| 6,077,157 | A * | 6/2000 | Fairbairn | C23C 16/4412 |
| | | | | 454/49 |
| 6,607,602 | B1 * | 8/2003 | Granneman | H01L 21/67781 |
| | | | | 118/719 |
| 9,214,371 | B2 | 12/2015 | Nitadori | |
| 2002/0037210 | A1 * | 3/2002 | Matsunaga | C23C 16/54 |
| | | | | 414/416.08 |
| 2003/0098125 | A1 * | 5/2003 | An | H01L 21/31116 |
| | | | | 156/345.31 |
| 2008/0210168 | A1 * | 9/2008 | Su | H01L 21/67109 |
| | | | | 118/729 |
| 2009/0191718 | A1 * | 7/2009 | Nakashima | C23C 16/45502 |
| | | | | 438/758 |
| 2012/0168144 | A1 * | 7/2012 | Erickson | C23C 16/4411 |
| | | | | 165/287 |
| 2019/0198359 | A1 * | 6/2019 | Kamimura | H01L 21/6719 |

FOREIGN PATENT DOCUMENTS

| | | | |
|---|---|---|---|
| JP | 2002173775 | A | 6/2002 |
| JP | 2007141929 | A | 6/2007 |
| JP | 2008311618 | A | 12/2008 |
| JP | 2009295782 | A | 12/2009 |
| JP | 2013026509 | A | 2/2013 |
| JP | 2016516291 | A | 6/2016 |
| KR | 19980010306 | A | 4/1998 |
| KR | 20060062981 | A | 6/2006 |
| KR | 20080068589 | A | 7/2008 |
| KR | 20100031896 | A | 3/2010 |
| KR | 20120074326 | A | 7/2012 |
| KR | 101463592 | B1 | 11/2014 |
| TW | 561518 | B | 11/2003 |
| WO | WO-2018003072 A1 * | | 1/2018 ....... H01L 21/67017 |

* cited by examiner

SUBSTRATE PROCESSING SYSTEM

CROSS-REFERENCE TO RELATED APPLICATION

This application claims priority to Korean Patent Application No. 10-2018-0051460 filed on May 3, 2018 and all the benefits accruing therefrom under 35 U.S.C. § 119, the contents of which are incorporated by reference in their entirety.

BACKGROUND

The present disclosure relates to a substrate processing system, and more particularly, to a substrate processing system including a plurality of process tubes.

In general, substrate processing methods are classified into a single wafer type capable of performing a substrate processing process on one substrate and a batch type capable of performing a substrate processing process on a plurality of substrates at the same time. Although the single wafer type has an advantage in simple configuration of facilities, the single wafer type has a disadvantage in productivity. Thus, the batch type has been widely used for mass production.

Since a batch type substrate processing system of the related art includes only a single process tube, when one stand alone type substrate processing system is used, a substrate processing amount decreases, and costs for manufacturing an element using the processed substrate increases.

Also, when a plurality of stand alone type substrate processing systems are simultaneously used to compensate the low substrate processing amount, a foot print occupied by the entire substrate processing system increases. Also, when a space for operating and maintaining the substrate processing system is required, the foot print for the substrate processing process further increases.

Thus, the substrate processing system capable of minimizing the foot print while increasing the substrate processing amount is required.

SUMMARY

The present disclosure provides a substrate processing system capable of decreasing a foot print thereof while increasing a substrate processing amount by including a plurality of process tubes.

In accordance with an exemplary embodiment, a substrate processing system includes: first and second process tubes spaced apart from each other in a first axial direction to provide process spaces independent from each other; a substrate boat on which a plurality of substrates are multiply stacked and which is provided to each of process spaces of the first and second process tubes; and first and second boat elevation units provided to the first and second process tubes, respectively, to elevate the substrate boat, and each of the first and second boat elevation units includes an elevation shaft member disposed in a space between the first and second process tubes.

An elevation shaft member of the first boat elevation unit and an elevation shaft member of the second boat elevation unit may be point-symmetric to each other and arranged at both sides of the first axis.

Each of the first and second boat elevation unit may include: an elevation body connected to the elevation shaft member to elevate along the elevation shaft member; and a support plate coupled to the elevation body to support the substrate boat, and the elevation body may be coupled to the support plate while being deviated in a second axial direction crossing the first axial direction from a center of the support plate.

The elevation shaft member may include: a ball screw including a screw shaft and a ball nut to move the ball nut through rotation of the screw shaft; and a plurality of guide rails arranged at both sides of the screw shaft.

The elevation body may include: a base plate coupled to the ball nut, and extending along the screw shaft; and a plurality of sliding parts coupled to the base plate at both sides of the ball nut, and configured to slide while being connected to the plurality of guide rails, respectively.

The elevation shaft member may further include a vertical frame extending along the screw shaft to support the screw shaft and the plurality of guide rails.

The substrate processing system may further include first and second utility modules provided to the corresponding first and second process tubes, respectively, and symmetrically arranged while being deviated from a vertical axis of the first axis at a center of the corresponding process tube of the first and second process tubes.

Each of the first and second utility modules may extend in a direction away from the corresponding process tube.

Each of the first and second utility modules may include: a cooling water control part connected to a cooling water supply line extending from the corresponding process tube and configured to control supply of a cooling water; and a gas control part connected to a gas supply line extending from the corresponding process tube and configured to control supply of a process gas, and in each of the first and second utility modules, the cooling water control part may be disposed closer to the corresponding process tube than the gas control part.

The substrate processing system may further include: first and second exhaust ducts provided to the first and second process tubes, respectively, and having ends connected to a plurality of exhaust pumping ports, respectively; first and second heater parts provided to the first and second process tubes, respectively, and configured to supply heat to the first and second process tubes, respectively; and first and second quick heat dissipation gas line configured to cool the first and second heater parts, respectively, and having ends connected to a plurality of heat absorption pumping ports, respectively. An end of the exhaust duct provided to the corresponding process tube and an end of the quick heat dissipation gas line configured to cool the heater part configured to supply heat to the corresponding process tube may be disposed on the first and second utility modules, respectively, and the end of the arranged exhaust duct may be disposed closer to the corresponding process tube than the end of the arranged quick heat dissipation gas line in each of the first and second utility modules.

Each of the gas supply lines may include a plurality of gas lines, the plurality of gas lines of the gas supply line connected to the first process tube and the plurality of gas lines of the gas supply line connected to the second process tube may be arranged symmetrically to each other, and the symmetric gas lines may be supplied with the same gas as each other.

Each of the first and second process tubes may be provided to as a single tube, or a plurality of tubes which include an outer tube and an inner tube.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

Figure 1:
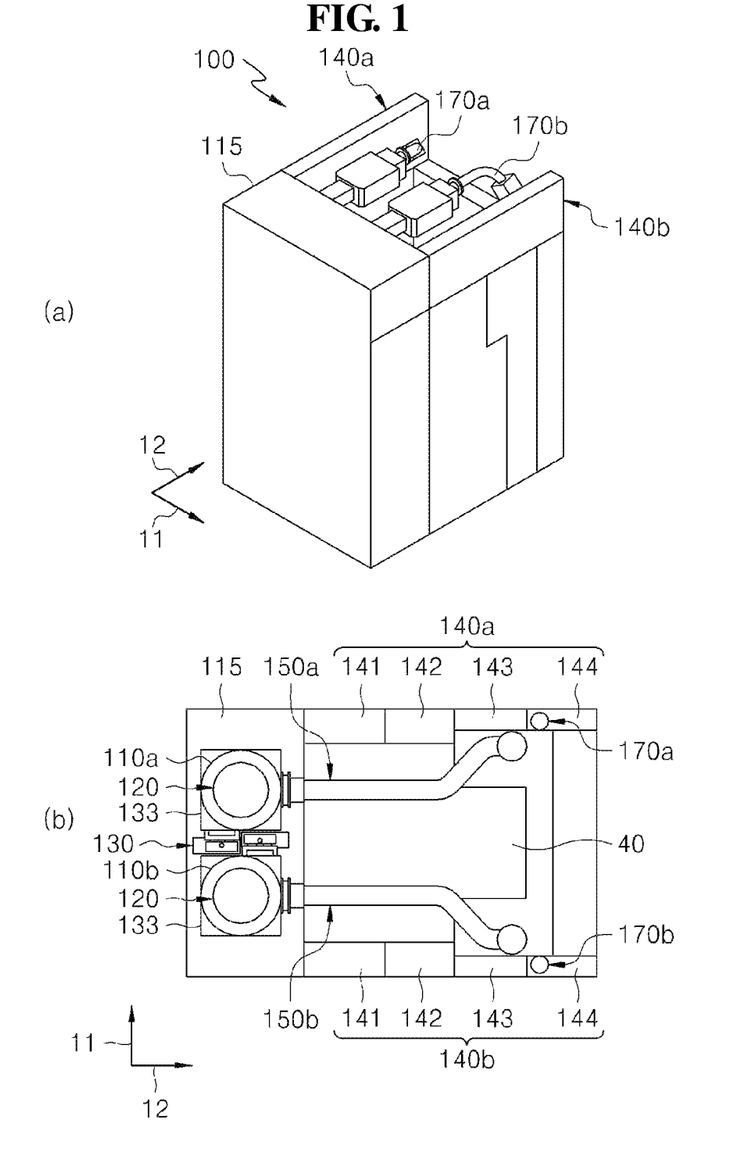
FIG. 1 is a cross-sectional view illustrating a substrate processing system in accordance with an exemplary embodiment.

FIG. 1 is a schematic view illustrating a substrate processing system in accordance with an exemplary embodiment. (a) of FIG. 1 is a partial perspective view illustrating the substrate processing system, and (b) of FIG. 1 is a partial plan view illustrating the substrate processing system.

Referring to FIG. 1, a substrate processing system 100 in accordance with an exemplary embodiment may include: first and second process tubes 110a and 110b that are spaced apart from each other in a first axis 11 and provide process spaces independent from each other; a substrate boat 120 in which a plurality of substrates 10 are stacked in multiple stages and which is provided to each of the process spaces of the first and second process tubes 110a and 110b; and first and second boat elevation units 130a and 130b provided to each of the first and second process tubes 110a and 110b and elevating the substrate boat 120.

The first and second process tubes 110a and 110b may be spaced apart from each other in the first axis 11, provided in pair, and disposed in the process spaces independent from each other. Here, a direction of the first axis 11 may be a horizontal direction and a direction crossing the substrate processing system 100. Each of the first and second process tubes 110a and 110b may have an inner space, accommodate the substrate boat 120 during a substrate processing process, and have a gas atmosphere (or atmosphere gas), a temperature, and the like, which are independently controlled. As the first and second process tubes 110a and 110b are independently controlled, the substrate processing process may be stably performed, an amount and quality of processing a substrate through the substrate processing system 100 may improve, and a foot print may decrease by reducing a distance between the first and second process tubes 110a and 110b and/or peripheral components disposed therearound. Here, each of the first and second process tubes 110a and 110b may be provided as a single tube or a plurality of tubes. An exemplary embodiment is not limited to the kind of each of the first and second process tubes 110a and 110b as long as the substrate boat 120 is accommodated therein to perform the substrate processing process. For example, each of the first and second process tubes 110a and 110b may include an outer tube and an inner tube.

The substrate boat 120, on which the plurality of substrates 10 may be stacked in multiple stages (or in a vertical direction) to perform the substrate processing process in a batch type, may be provided to each of the process spaces of the first and second process tubes 110a and 110b and accommodated in the inner spaces (or process spaces) of the first and second process tubes 110a and 110b during the substrate processing process. Here, the substrate boat 120 may be provided in plurality, and a plurality of the substrate boats 120 may be provided to the first and second process tubes 110a and 110b, respectively. Here, each of the substrate boats 120 may have a plurality of process spaces for individually processing the plurality of substrates 10.

The first and second boat elevation units 130a and 130b may be provided to the first and second process tubes 110a and 110b, respectively, and independently elevate the substrate boats 120. Here, the first and second boat elevation units 130a and 130b may elevate the substrate boat 120 to be accommodated in each of the first and second process tubes 110a and 110b and provide the substrate boat 120 in the process spaces of the first and second process tubes 110a and 110b to load the plurality of substrates 10 in the process spaces of the first and second process tubes 110a and 110b. For example, the first and second boat elevation units 130a and 130b may support and elevate the substrate boat 120.

Figure 2:
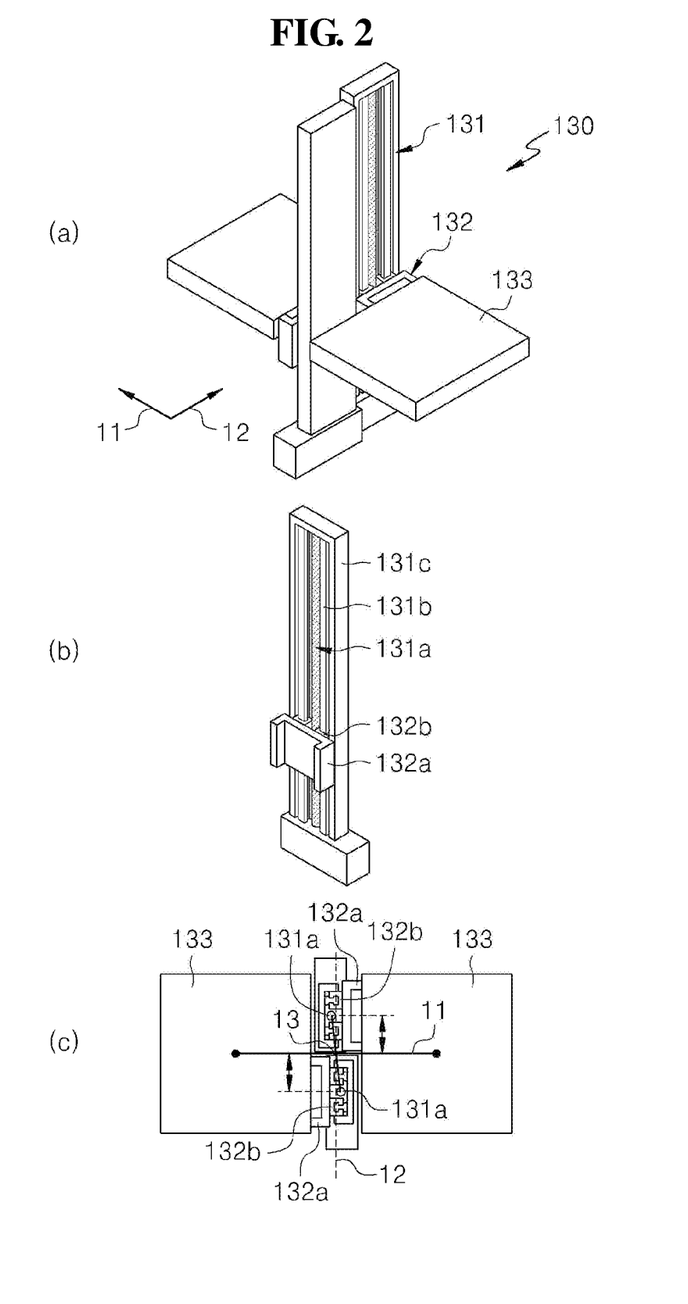
FIG. 2 is a view illustrating a boat elevation unit in accordance with an exemplary embodiment.

FIG. 2 is a view illustrating a boat elevation unit in accordance with an exemplary embodiment. (a) of FIG. 2 is a view illustrating first and second boat elevation units, (b) of FIG. 2 is a view illustrating an elevation shaft member and an elevation body, and (c) of FIG. 2 is a plan view illustrating the first and second boat elevation units.

Referring to FIG. 2, each of the first and second boat elevation units 130a and 130b may include an elevation shaft member 131 disposed in a space between the first and second process tubes 110a and 110b. The elevation shaft member 131 may be disposed in the space between the first and second process tubes 110a and 110b, and disposed toward the respective process tube 110 (i.e., corresponding process tube of the first and second process tubes). Through this, the space between the first and second process tubes 110a and 110b may be utilized, and, as the elevation shaft member 131 does not extend to the outside from a pair of the first and second process tubes 110a and 110b, a width in the first axis 11 and/or a width in a second axis 12 crossing the first axis 11 of the substrate processing system 100 may be reduced.

The elevation shaft member 131 of the first boat elevation unit 130a and the elevation shaft member 131 of the second boat elevation unit 130b may be point-symmetric to each other and disposed at both sides of the first axis 11, respectively. As the elevation shaft member 131 of the first boat elevation unit 130a and the elevation shaft member 131 of the second boat elevation unit 130b are disposed at the both sides of the first axis 11 (or both sides of a line connecting a center of the first process tube and a center of the second process tube) (e.g. in a direction of the second axis), the space between the first and second process tubes 110a and 110b may be reduced, and the width in the first axis 11 of the substrate processing system 110 may be further reduced. Also, the elevation shaft member 131 of the first boat elevation unit 130a and the elevation shaft member 131 of the second boat elevation unit 130b may be point-symmetric with respect to a point on the first axis 11, and point-symmetric with respect to a cross-point between the first axis 11 and the second axis 12 while facing the respective process tube 110. Accordingly, the elevation shaft member 131 of the first boat elevation unit 130a and the elevation shaft member 131 of the second boat elevation unit 130b may be disposed at the both sides of the line connecting the center of the first process tube 110a and the center of the second process tube 110b to stably elevate the substrate tube 120 although deviated from the center of the respective center of the process tube 110.

Figure 3:
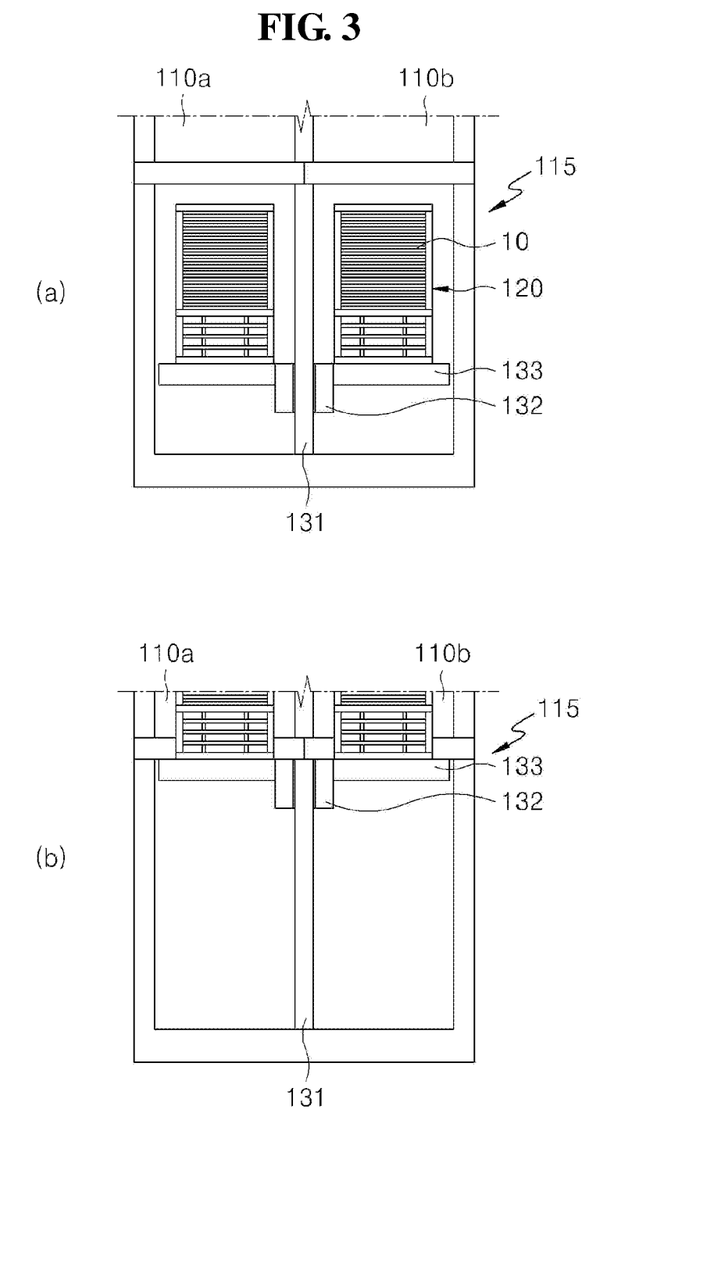
FIG. 3 is a conceptual view for explaining elevation of a substrate boat in accordance with an exemplary embodiment.

FIG. 3 is a concept view for explaining the elevation of the substrate boat in accordance with an exemplary embodiment. (a) of FIG. 3 is a view illustrating a state before the elevation, and (b) of FIG. 3 is a view illustrating a state after the elevation.

Referring to FIGS. 2 and 3, each of the first and second boat elevation units 130a and 130b may include: an elevation body 132 connected to the elevation shaft member 131 to elevate along the elevation shaft member 131; and a support plate 133 coupled to the elevation body 132 to support the substrate boat 120. The elevation body 132 may be connected to the elevation shaft member 131 and elevated along the elevation shaft member 131. The support plate 133, which is coupled to the elevation body 132, may be elevated by the elevation of the elevation body 132, and accordingly the substrate boat 120 supported by the support plate 133 may be elevated.

The support plate 133 may be coupled to the elevation body 132 and support the substrate boat 120. The support plate 133 may be coupled to the elevation body 132 and elevated together with the elevation body 132, and elevate the substrate boat 120 that is supported by the support plate 133. Here, the exemplary embodiment is not limited to the shape of the support plate 133 as long as the support plate 133 is coupled to the elevation body 132 and stably supports the substrate boat 120.

Also, the elevation body 132 may be coupled to the support plate 133 while deviated in the direction of the second axis 12, which crosses the direction of the first axis 11, from a center of the support plate 133. Since the elevation shaft member 131 of the first boat elevation unit 130a and the elevation shaft member 131 of the second boat elevation unit 130b are point-symmetric at the both sides of the first axis 11, the elevation body 132 may be coupled to the support plate 133 while being deviated in the direction of the second axis 12 crossing the direction of the first axis 11 from the center of the support plate 133 so that the center of the support plate 133 is aligned with a center of a corresponding process tube of the first and second process tubes 110a and 110b. Here, the elevation bodies 132 may be coupled to the respective support plates 133 while being deviated in a direction in which each of the elevation bodies is away from the center of each of the respective coupled support plates 133 (or in a direction in which each of the elevation bodies is away to each of the both sides of the line connecting the center of the first process tube and the center of the second process tube). Also, the support plate 133 coupled to the elevation body 132 may extend toward the line connecting the center of the first process tube 110a and the center of the second process tube 110b, and the center of the support tube 133 may be aligned with the center of the corresponding process tube 110. Accordingly, although the elevation shaft member 131 is deviated from the center of the process tube 110 (or the line connecting the center of the first process tube and the center of the second process tube), the substrate boat 120 may be stably elevated through the elevation body 132 and the support plate 133, and as the substrate boat 120 is accommodated in the inner space of each of the process tubes 110, the plurality of substrates 10 may be loaded to the process space of each of the process tubes 110.

Also, the elevation shaft member 131 may include: a ball screw 131a including a screw shaft and a ball nut to move the ball nut through rotation of the screw shaft; and a plurality of guide rails 131b disposed at both sides of the screw shaft. The ball screw 131a is a mechanical component that is used to convert a rotation movement into a linear movement or, on the contrary, a linear movement into a rotation movement. The ball screw may transmit power by circulating a ball disposed between the screw and the nut. The ball screw may include a screw shaft serving as a screw and a ball nut in which the ball is inserted into the nut. The ball screw 131a may move the ball nut through the rotation of the screw shaft and elevate the elevation body 132 coupled to the ball nut by the movement of the ball nut. For example, the screw shaft may vertically stand, and the ball nut may ascend or descend according to the rotation of the screw shaft while being restricted by the screw shaft. Also, as the ball screw 131a point-contacts the ball during movement of the ball nut, accordingly, particles may be further reduced than a rope or a chain, which generates line-contact, and further effectively reduced than a rack and pinion, which generates surface-contact. Here, the screw shaft may rotate by a power source such as a servo-motor, and the ball nut may be elevated along a shaft of the screw shaft while the ball inserted into the nut moves along a screw thread (or screw groove) by the rotation of the screw shaft.

The plurality of guide rails 131b may be disposed at the both sides of the screw shaft while being parallel to the screw shaft. Here, the plurality of guide rails 131b may be disposed symmetric to each other with respect to the screw shaft. Through this, the elevation body 132 may be stably coupled to the elevation shaft member 131 by being coupled to the plurality of guide rails 131b as well as the ball screw 131a, and as the symmetrically arranged plurality of guide rails 131b adjust balance of the elevation body 132 during elevation, the elevation body 132 and/or the substrate boat 120 may be stably elevated. Accordingly, although as the elevation shaft member 131 is deviated from the center of the process tube 110, the elevation body 132 is coupled to the support plate 133 while being deviated to one side in the direction of the second axis 12 from the center of the support plate 133, the elevation body 132 may stably elevate the substrate boat 120 without being inclined or distorted.

The plurality of guide rails 131b may be different in size or width (or thickness). Since the elevation body 132 is coupled while being biased to one side from the center of the support plate 133, a force (or load) may be biased to one side of the elevation body 132. Thus, the guide rail 131b, to which a relatively greater force is applied, may have a greater size or width to adjust balance between the both sides of the elevation body 132. Also, a distance between each of the guide rails 131b and the screw shaft may be varied. However, in this case, the width of the elevation shaft member 131 in the direction of the second axis 12 may become too wide, the screw shaft may be spaced too much from the center of each of the process tubes 110, and the width of the substrate processing system 100 in the direction of the second axis 12 may increase.

The elevation body may include: a base plate 132a coupled to the ball nut and extending along the screw shaft; and a plurality of sliding parts 132b coupled to the base plate 132a at both sides of the ball nut and sliding while being connected to the plurality of guide rails 131b, respectively. The base plate 132a may be coupled to the ball nut, and elevated together with the ball nut, which is elevated along the shaft of the screw shaft, by the rotation of the screw shaft. Also, the base plate 132a may extend along the screw shaft in an extension direction of the screw shaft. As the base plate 132a extends along the screw shaft, an area in which the elevation body 132 is supported by (or fixed to) the elevation shaft member 131 may increase. Through this, the elevation body 132 may be stably connected to (or supported by) the elevation shaft member 131, and stably support (or hold) the support plate 133 that supports the substrate boat 120. Accordingly, although the elevation body 132 is coupled to the support plate 133 while being biased to one side from the center of the support plate 133 in the direction of the second axis 12, the substrate boat 120 may be stably supported and elevated by the support plate 133 without inclination or distortion of the elevation body 132 and/or the support plate 133.

The plurality of sliding parts 132b may be coupled to the base plate 132a while being spaced apart from each other to both sides, disposed at both sides of the ball nut, and connected to the plurality of guide rails 131b, respectively. Here, the plurality of sliding parts 132b connected to the plurality of guide rails 131b, respectively, may slide along the plurality of guide rails 131b. The plurality of sliding parts 132b may include a ball. The plurality of sliding parts 132b may slide while the ball moves along a guide groove defined in the plurality of guide rails 131b. The base plate 132a may be supported by being connected to the plurality of guide rails 131b through the plurality of sliding parts 132b. Since the base plate 132a is doubly supported by the screw shaft through the ball nut and the plurality of guide rails 131b through the plurality of sliding parts 132b, the base plate 132a may be stably elevated without being inclined or distorted. Also, as the plurality of sliding parts 132b slide along the plurality of guide rails 131b, the base plate 132a may be effectively elevated although being supported by various components in addition to the screw shaft.

The elevation shaft member 131 may further include a vertical frame 131c extending along the screw shaft and supporting the screw shaft and the plurality of guide rails 131b. The vertical frame 131c may extend along the screw shaft, and fix and support the screw shaft and the plurality of guide rails 131b. For example, the vertical frame 131c may serve as a housing in which the screw shaft and the plurality of guide rails 131b are accommodated and coupled. Also, the vertical frame 131c, the screw shaft, and the plurality of guide rails 131b may be provided as one assembly. Through the vertical frame 131c, the screw shaft and the plurality of guide rails 131b, which vertically stand, may be stably supported (or fixed) in a vertically stand state, and may not be inclined or distorted while elevating the support plate 133, which supports the substrate boat 120, through the elevation body 132.

Here, the vertical frame 131c may have a width in the direction of the second axis 12 greater than that in the direction of the first axis 11. When the elevation body 132 is coupled to the support plate 133 while being deviated to one side in the direction of the second axis 12 from the center of the support plate 133, a force (or load) may be applied to the elevation shaft member 131 while being biased to one side in the direction of the second axis 12. Here, as the vertical frame 131c has the width in the direction of the second axis 12 greater than that in the direction of the first axis 11, the vertical frame 131c may provide a supporting force for supporting the force applied while being biased to one side in the direction of the second axis 12. Accordingly, the elevation shaft member 131 may firmly vertically stand without being inclined or distorted, and the elevation body 132 coupled to the support plate 133 and the support plate 133 supporting the substrate boat 120 may be stably elevated along the elevation shaft member 131.

Also, the elevation shaft member 131 may further include a frame support 131d that is provided below the vertical frame 131c to support the vertical frame 131c and having a width in the direction of the second axis 12 greater than that of the vertical frame 131c in the direction of the second axis 12. The frame support 131d may be provided below the vertical frame 131c, support the vertical frame 131c, and have the width in the direction of the second axis 12 greater than that of the vertical frame 131c in the direction of the second axis 12. Through the frame support 131d provided below the vertical frame 131c to support the vertical frame 131c, the vertical frame 131c may further stably stand, and the elevation body 132, the support plate 133, and the substrate boat 120 may be stably elevated. Also, as the frame support 131d has the width in the direction of the second axis 12 greater than that of the vertical frame 131c in the direction of the second axis 12, the frame support 131d may further stably support the vertical frame 131c and prevent the vertical frame 131c from being inclined to one side due to the support plate 133 coupled to the elevation shaft member 131 while being biased to one side. Here, in order to reduce a portion of the support plate 133, which extends from the elevation shaft member 131 while being biased to one side, the frame support 131d may extend from the vertical frame 131c in a direction away from a line connecting the center of the first process tube 110a and the center of the second process tube 110b in the direction of the second axis 12.

Figure 4:
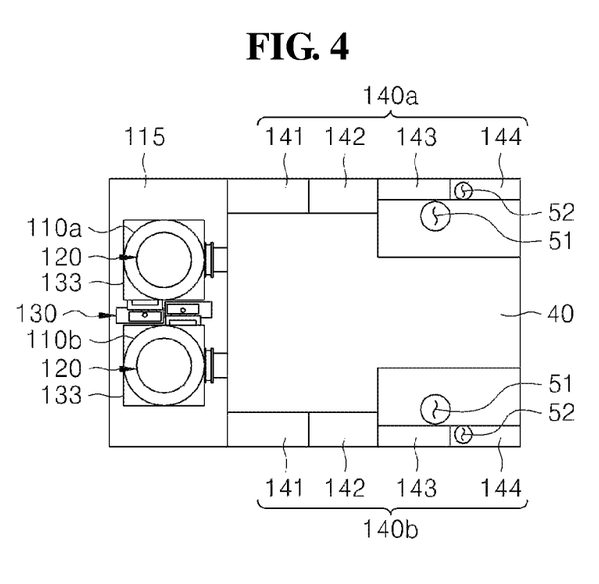
FIG. 4 is a conceptual view for explaining first and second utility modules in accordance with an exemplary embodiment.

FIG. 4 is a conceptual view for explaining first and second utility modules in accordance with an exemplary embodiment.

Referring to FIG. 4, the substrate processing system 100 in accordance with an exemplary embodiment may further include first and second utility modules 140a and 140b provided in correspondence to the first and second process tubes 110a and 110b, respectively, and symmetrically arranged while being deviated from a vertical axis of the first axis 11 of the center of the corresponding process tube 110 of the first and second process tubes 110a and 110b. The first and second utility modules 140a and 140b may be provided in correspondence to the first and second process tubes 110a and 110b, respectively, and symmetrically arranged while being deviated from the vertical axis (or an axis extending from the center of the process tube 110 in the second axial direction crossing the first axis) of the first axis 11 of the center of the corresponding process tube 110 of the first and second process tubes 110a and 110b. Here, the first and second utility modules 140a and 140b may be mounted to all sorts of utilities and electronic parts, which allows a substrate processing process to be performed at the first and second process tubes 110a and 110b. Here, the first and second utility modules 140a and 140b may be symmetrically arranged in a direction being spaced apart from each other, and deviated from the vertical axis of the first axis 11 at the center of the corresponding process tube 110 while maintaining a width equal to or greater than a distance between the centers of the first and second process tubes 110a and 110b by being spaced apart from each other. For example, the first and second utility modules 140a and 140b may be arranged in a diagonal direction for being spaced apart from each other or arranged in parallel to each other while maintaining a width greater than the distance between the centers of the first and second process tubes 110a and 110b.

When each of the first and second utility modules 140a and 140b is deviated from the vertical axis of the first axis 11 at the center of the corresponding process tube 110, a space between the first and second utility modules 140a and 140b may increase to secure a wide maintenance space 40. For example, the first and second utility modules 140a and 140b may extend from the center of the corresponding process tube 110 in an oblique direction (or diagonal direction) and be deviated from the vertical axis of the first axis 11 at the center of the corresponding process tube 110, or may extend while being deviated from the center of the corresponding process tube 110 to the direction of the first axis 11 and be deviated from the vertical axis of the first axis 11 at the center of the corresponding process tube 110. Here, the first and second utility modules 140a and 140b may be arranged symmetric to each other, and when each of the first and second utility modules 140a and 140b extend in the direction of the second axis 12, the substrate processing system 100 may have a minimum width in the direction of the first axis 11.

Also, the first and second utility modules 140a and 140b may be arranged at both ends of the first and second process tubes 110a and 110b in parallel in the direction of the second axis 12, or arranged in parallel while extending in the direction of the second axis 12 from both ends of a processing portion 115 (or processing area) on which the first and second process tubes 110a and 110b are disposed. In this case, the width of the substrate processing system 100 in the direction of the first axis 11 may be minimized, and also the maintenance space 40 may be maximized.

Each of the first and second utility modules 140a and 140b may extend in a direction away from the corresponding process tube 110.

In a related art, the utility module 140 is disposed to fill an empty space such that components of the process tube 110 are distributed in the direction of the second axis 12 instead of extending in one direction. For example, the utility module 140 is disposed in the direction of the first axis 11 at the direction of the second axis 12 of the process tube 110, and when the utility modules fill the width in the direction of the first axis 11 (e.g., similar to the width of the process tube), the rest components are disposed in a next row in the direction of the first axis 11. Here, components (e.g., an exhaust duct, etc.) that are connected to the process tube 110 and require a somewhat distance (e.g., a distance in the direction of the second axis) are necessary to extend in the direction of the second axis 12. Accordingly, the substrate processing system 100 also has the extended width in the direction of the first axis 11 and/or the extended width in the direction of the second axis 12. Also, since a space in the direction of the second axis 12 of the process tube 110 is hardly secured, the maintenance space 40 for the process tube 110 or the like may not be provided.

However, when each of the first and second utility module 140a and 140b extends in a direction away from the corresponding process tube 110, the width of the substrate processing system 100 in the direction of the first axis 11 or in the direction of the second axis 12 may be reduced, and also the maintenance space 40 may be secured between the first and second utility modules 140a and 140b. Also, the components, which are connected to the first and second process tubes 110a and 110b and require a somewhat length, may extend until ends of the first and second utility modules 140a and 140b in the direction of the second axis 12 and disposed on the ends of the first and second utility modules 140a and 140b in a perpendicular direction (or vertical direction). Accordingly, the width of the substrate processing system 100 in the direction of the second axis 12 or in the direction of the first axis 11 may be reduced.

Each of the first and second utility modules 140a and 140b may include: a cooling water control part 141 connected to a cooling water supply line 20 extending from the corresponding process tube 110 and controlling supply of a cooling water; and a gas control part 142 connected to a gas supply line 30 extending from the corresponding process tube 110 and controlling supply of a process gas. The cooling water control part 141 may be connected to the cooling water supply line 20 extending from the corresponding process tube 110 and control the supply of a process cooling water (PCW). Here, the cooling water control part 141 may supply and check the cooling water that is necessary for driving the first and second process tubes 110a and 110b. For example, the cooling water control part 141 may include a cooling water valve and control supply of the cooling water to the corresponding process tube 110. The cooling water may be provided from a cooling water supply source (not shown) to the corresponding process tube 110 through the cooling water control part 141, and the cooling water provided to the corresponding process tube 110 may pass through a cooling path defined (or provided) in the corresponding process tube 110 and be discharged through the cooling water control part 141.

The gas control part 142 may be connected to the gas supply line 30 extending from the corresponding process tube 110 and control supply of the process gas. Here, the gas control part 142 may transfer the process gas supplied to the first and second process tubes 110a and 110b. For example, the gas control part 142 may include a gas panel and control the supply of the process gas to the corresponding process tube 110. The gas panel may generally measure various kinds of gases that are used for the process gas, and include a gas separator for distributing the plurality of gases to the process tube 110 and a mass flow controller (MFC) for adjusting gas flow. Here, at least one of the plurality of gases may be supplied by a component such as a preheater, a mass flow controller (MFC), a bubbler, and a filter. The process gas may be supplied to the corresponding process tube 110 from the process gas supply source (not shown) through the gas control part 142. Here, the process gas may be heated for efficient substrate processing and supplied to the corresponding process tube 110.

Also, the cooling water control part 141 may be disposed closer to the corresponding process tube 110 than the gas control part 142 in each of the first and second utility modules 140a and 140b. The cooling water may be supplied to the corresponding process tube 110, which is adjacent thereto, for efficient cooling, and thus a supply distance (or flow distance) may be short. Accordingly, the cooling water control part 141 may be disposed adjacent to the corresponding process tube 110 so that the cooling water is supplied to the corresponding process tube 110 adjacent thereto. The cooling water control part 141 may be disposed closest to the corresponding process tube 110 while being disposed closer to the corresponding process tube 110 than the gas control part 142. Through this, the cooling water may be supplied to the corresponding process tube 110 almost without temperature change (e.g. temperature increase) due to a short supply distance, and effectively cool an area supplied with the processing cooling water in the corresponding process tube 110.

The heated process gas may pass through the gas control part 142, and a component for heating the gas such as a preheater may be disposed in the gas control part 142. In general, an overall temperature of the gas control part 142 may be greater than that of the cooling water control part 141. Accordingly, when the cooling water control part 141 is disposed away from the corresponding process tube 110 further than the gas control part 142, the cooling water may increase in supply distance and increase in temperature by a temperature of the gas control part 142 while passing through surroundings of the gas control part 142, and thus effective cooling may not be performed by the cooling water.

However, in accordance with an exemplary embodiment, as the cooling water control part 141 is disposed closer to the corresponding process tube 110 than the gas control part 142, effective cooling of the cooling water may be performed on an area, which is supplied with the cooling water, of the corresponding process tube 110.

Figure 5:
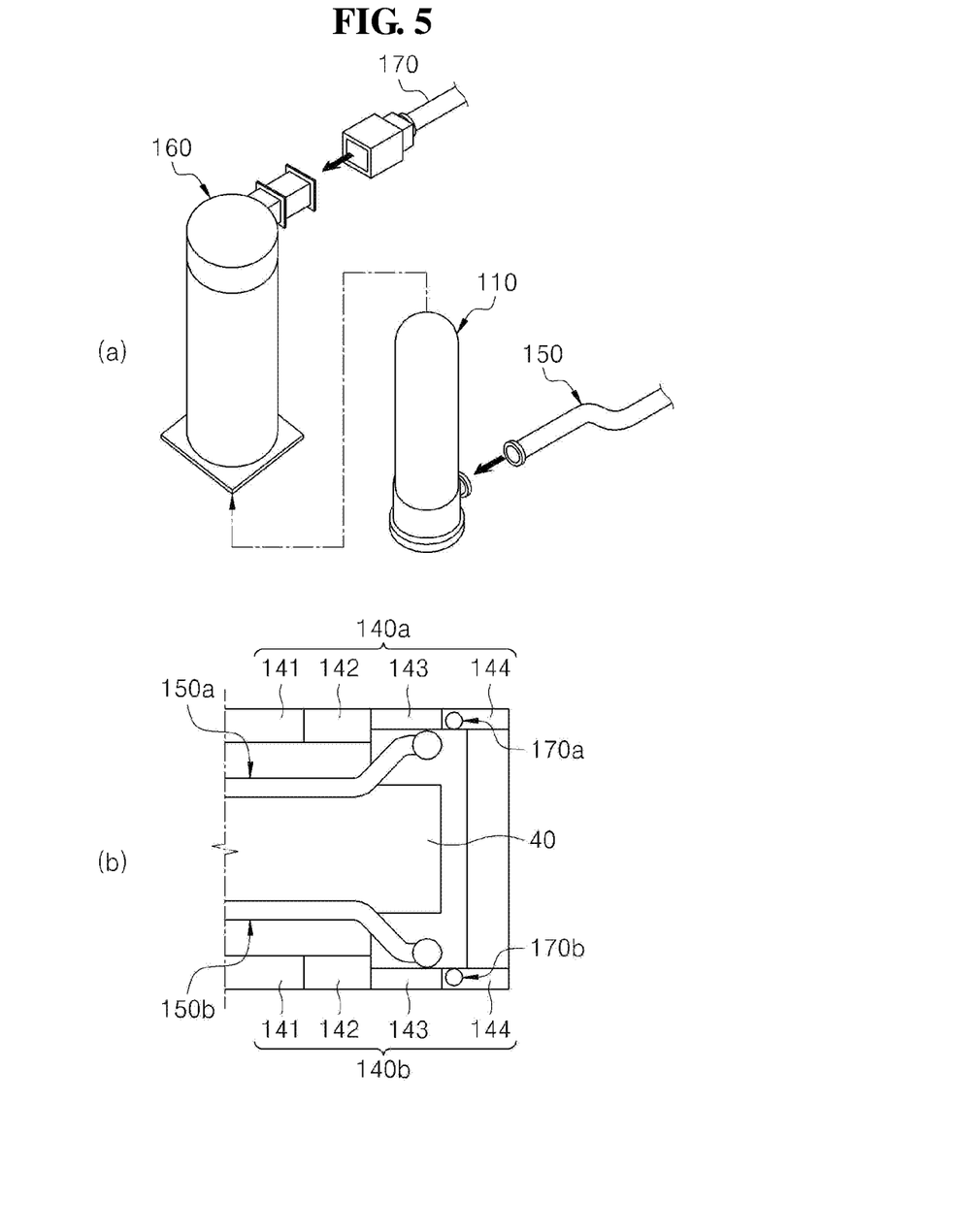
FIG. 5 is a conceptual view for explaining an exhaust duct, a heater part, and a quick heat dissipation gas line in accordance with an exemplary embodiment.

FIG. 5 is a conceptual view for explaining an exhaust duct, a heater part, and a quick heat dissipation gas line in accordance with an exemplary embodiment, (a) of FIG. 5 is an exploded view illustrating a process tube, an exhaust duct, a heater part, and a quick heat dissipation gas line, and (b) of FIG. 5 is a view illustrating positions of an end of the exhaust duct and an end of the quick heat dissipation gas line.

Referring to FIG. 5, the substrate processing system 100 in accordance with an exemplary embodiment may further include: first and second exhaust ducts 150a and 150b which are provided to the first and second process tubes 110a and 110b, respectively, and have ends connected to the plurality of exhaust pumping port 51, respectively; first and second heater parts 160 provided to the first and second process tubes 110a and 110b to supply heat to the first and second process tubes 110a and 110b, respectively; and first and second quick heat dissipation gas lines 170a and 170b which cools the first and second heater parts 160, respectively, and have ends connected to the plurality of heat absorption pumping ports 52, respectively. The first and second exhaust ducts 150a and 150b may be provided to the first and second process tubes 110a and 110b, respectively, and have ends connected to the plurality of exhaust pumping port 51, respectively, to exhaust a gas (or residual gas) in the first and second process tubes 110a and 110b. Here, through the exhaustion, a vacuum state may be maintained in the first and second process tubes 110a and 110b. The first and second exhaust ducts 150a and 150b may have one ends connected to the first and second process tubes 110a and 110b, respectively, and the other ends (i.e., ends) extending in the direction of the second axis 12 and connected to (or communicated with) the exhaust pumping port 51. Here, the exhaust pumping port 51 may be disposed below the substrate processing system 100 or disposed outside the substrate processing system 100. Also, the first and second exhaust ducts 150a and 150b may extend and bent in the direction of the second axis 12 so that the end (the other end) extend in a perpendicular direction (or vertical direction) in order to be connected to the exhaust pumping port 51.

The first and second heater parts 160 may be provided to the first and second process tubes 110a and 110b and supply heat to the first and second process tubes 110a and 110b, respectively. For example, the first and second heater parts 160 may be provided outside the first and second process tubes 110a and 110b and accommodate and heat the first and second process tubes 110a and 110b, respectively. Through this, a plurality of substrates 10 accommodated in the first and second process tubes 110a and 110b, respectively, may increase in temperature so that reaction (or substrate processing) is performed.

The first and second quick heat dissipation gas lines 170a and 170b may cool the first and second heater parts 160, respectively, and have ends connected to the plurality of heat absorption pumping port 52, respectively, to exhaust heat (or hot air) at the outside (or surroundings) of the first and second process tubes 110a and 110b and cool each of the first and second process tubes 110a and 110b. As necessary, the first and second heater parts 160 may be cooled to prevent the plurality of substrates 10 from excessively increasing in temperature and quickly decrease temperatures of the first and second heater parts 160 and/or the first and second process tubes 110a and 110b after the substrate processing (e.g., heat treatment) of the plurality of substrates 10. For example, an air injection hole (not shown) through which external air is injected into the first and second heater parts 160 may be defined in an outer wall (e.g., sidewall) of the first and second heater parts 160, and the air, which is injected into the first and second heater parts 160 and heat-exchanged by inner-temperature of the first and second heater parts 160, may be exhausted to the first and second quick heat dissipation gas line 170a and 170b. Here, the first and second quick heat dissipation gas line 170a and 170b may have ends connected to the outer walls of the first and second heater parts 160, respectively, and extend in the direction of the second axis 12 so that the other ends (i.e., ends) are connected to the heat absorption pumping port 52, thereby quickly exhausting the air that is heat-exchanged. Here, the heat absorption pumping port 52 may be disposed below or outside the substrate processing system 100, and the first and second quick heat dissipation gas lines 170a and 170b may extend in the direction of the second axis 12 and then be bent so that ends thereof extend in a perpendicular direction (or vertical direction) in order to be connected to the heat absorption pumping port 52. Through this, the air injected into the first and second heater parts 160 from the outside may cool the heat source of the first and second heater parts 160 and the outer wall of the first and second process tubes 110a and 110b in the first and second heater parts 160. Accordingly, the heat source of the first and second heater parts 160 may be prevented from excessively increasing in temperature to excessively heat the plurality of substrates 10, and simultaneously quickly cool the heat source (or the temperature of the heat source) of the first and second heater parts 160, so that the first and second process tubes 110a and 110b are quickly cooled. Also, as the first and second process tubes 110a and 110b are quickly cooled, the plurality of substrates 10 may be quickly cooled.

Also, the end of the exhaust duct 150 provided to the corresponding process tube 110 and the end of the quick heat dissipation gas line 170, which cools the heater part 160 supplying heat to the corresponding process tube 110, may be disposed on the first and second utility modules 140a and 140b, respectively. Here, each of the first and second utility modules 140a and 140b may further include: an exhaust duct accommodation part 143 for accommodating the end of the exhaust duct 150 provided to the corresponding process tube 110; and a heat dissipation line accommodation part 144 for accommodating the end of the quick heat dissipation gas line 170 cooling the heat part 160 supplying heat to the corresponding process tube 110. The exhaust duct accommodation part 142 may accommodate the end of the exhaust duct 150 provided to the corresponding process tube 110, be provided together with a housing, and be disposed in each of the first and second utility modules 140a and 140b such that the end of the exhaust duct 150, which vertically extends and is connected to the exhaust pumping port 51, is accommodated in the exhaust duct accommodation part 143. Here, the exhaust duct accommodation part 143 may include a pressure valve and a pressure gauge, and control a suction force (or suction pressure) through the exhaust pumping port 51 to maintain a vacuum state in each of the first and second process tubes 110*a* and 110*b*. The end of the exhaust duct 150 may not be interfered with other components by accommodating the vertically extending end of the exhaust duct 150 in the exhaust duct accommodation part 143, and the maintenance space 40 may increase by effectively arranging the exhaust duct 150 according to arrangement (or arrangement order) of components of the first and second utility modules 140*a* and 140*b*.

The heat dissipation accommodation part 144 may accommodate the end of the quick heat dissipation gas line 170, which cools the heater part 160 for supplying heat to the corresponding process tube 110, and be provided together with the housing. Here, the end of the quick heat dissipation gas line 170, which vertically extends and is connected to the heat absorption pumping port 52, may be accommodated in the heat dissipation line accommodation part 144 and disposed on each of the first and second utility modules 140*a* and 140*b*. The end of the quick heat dissipation gas line 170 may not be interfered with other components by accommodating the vertically extending end of the quick heat dissipation gas line 170 in the heat dissipation line accommodation part 144, and the maintenance space 40 may increase by effectively arranging the quick heat dissipation gas line 170 according to the arrangement (or arrangement order) of the components of the first and second utility modules 140*a* and 140*b*.

Also, in each of the first and second utility modules 140*a* and 140*b*, the end of the arranged exhaust duct 150 may be disposed closer to the corresponding process tube 110 than the end of the arranged quick heat dissipation gas line 170. The quick heat dissipation gas line 170 may be greater in temperature than the exhaust duct 150 since the quick heat dissipation gas line 170 exhausts the air (or heat) heated through the heat-exchange for cooling the heat source of the first and second heater parts 160. When the end of the quick heat dissipation gas line 170 is disposed adjacent to the corresponding process tube 110, since high temperature of the quick heat dissipation line 170 affects the corresponding process tube 110 or other components of each of the first and second utility modules 140*a* and 140*b*, the end of the quick heat dissipation gas line 170 (i.e., heat dissipation line accommodation part) may be disposed away from the corresponding process tube 110 further than the end of the exhaust duct 150 (i.e., exhaust duct accommodation part). Here, the end of the quick heat dissipation gas line 170 may be disposed farthest from the corresponding process tube 110 in each of the first and second utility modules 140*a* and 140*b*. Also, as the end of the quick heat dissipation gas line 170 is disposed away from the corresponding process tube 110, the heat may be effectively dissipated (or cooled) by air (or external air) while passing through a long flow distance (or exhaust distance).

In each of the first and second utility modules 140*a* and 140*b*, the cooling water control part 141, the gas control part 142, the end of the exhaust duct 150, and the end of the quick heat dissipation gas line 170 may be arranged in a direction away from the corresponding process tube 110, and the cooling water control part 141 and the gas control part 142 may be arranged closer to the corresponding process tube 110 than the end of the exhaust duct 150 and the end of the quick heat dissipation gas line 170. In each of the first and second utility modules 140*a* and 140*b*, the cooling water control part 141, the gas control part 142, the end of the exhaust duct 150, and the end of the quick heat dissipation gas line 170 may be arranged in a row in a direction away from the corresponding process tube 110, and the cooling water control part 141, the gas control part 142, the end of the exhaust duct 150, and the end of the quick heat dissipation gas line 170 may be sequentially arranged. In this case, the lines (e.g., the cooling water supply line, the gas supply line, etc.) connected (or provided) to the cooling water control part 141 and the gas control part 142, respectively, may be effectively arranged without being tangled or twisted with the exhaust duct 150 and the quick heat dissipation gas line 170, and thus a space efficiency may be enhanced.

Here, the cooling water control part 141 and the gas control part 142 may be arranged closer to the corresponding process tube 110 than the end of the exhaust duct 150 and the end of the quick heat dissipation gas line 170. As the cooling water control part 141 and the gas control part 142 supply the cooling water and the process gas to the corresponding process tube 110, and the end of the exhaust duct 150 and the end of the quick heat dissipation gas line 170 exhaust the residual gas and heat from the corresponding process tube 110, the end of the exhaust duct 150 and the end of the quick heat dissipation gas line 170 may be disposed away from the corresponding process tube 110 because the end of the exhaust duct 150 and the end of the quick heat dissipation gas line 170 are not supplied to the corresponding process tube 110 and do not generate any limitation although a length (or flow distance) of the line is excessively long. As the supply distance to the corresponding process tube 110 is shortened by arranging the cooling water control part 141 and the gas control part 142, which supply the cooling water and the process gas to the corresponding process tube 110, to be adjacent to the corresponding process tube 110, the temperature change (e.g. temperature increase) due to the long supply distance may be prevented. Accordingly, the cooling water and the process gas, which maintain temperature almost without temperature change may be supplied to the corresponding process tube 110, and the substrate processing process may be effectively performed in the corresponding process tube 110.

Also, when the cooling water control part 141 and the gas control part 142, the end of the exhaust duct 150, and the end of the quick heat dissipation gas line 170 are arranged in order from the corresponding process tube 110, housings thereof may be arranged from a housing having a narrow width to a housing having a wide width. Thus, the space efficiency may be maximized, an effective area of the maintenance space 40, which is substantially usable, may be maximized, and the width of the substrate processing system 100 in the direction of the second axis 12 may be reduced. Also, the cooling water supply line 20 and the gas supply line 30 may be minimally affected in temperature or the like by the surroundings (e.g., the end of the exhaust duct and the end of the quick heat dissipation gas line).

Figure 6:
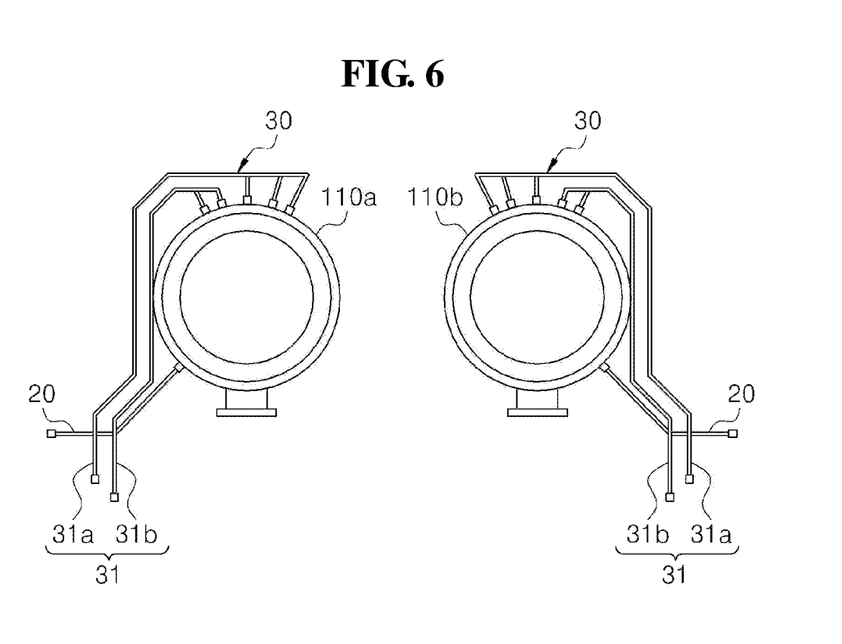
FIG. 6 is a conceptual view for explaining symmetric gas supply lines in accordance with an exemplary embodiment.

FIG. 6 is a conceptual view for explaining a symmetric gas supply line in accordance with an exemplary embodiment.

Referring to FIG. 6, each of gas supply lines 30 may include a plurality of gas lines 31. The plurality of gas lines 31 of the gas supply line 30 connected to the first process tube 110*a* and the plurality of gas lines 31 of the gas supply line 30 connected to the second process tube 110*b* may be symmetric to each other, and the symmetrically arranged gas lines 31 may be supplied with the same gas. The plurality of gas lines 31 may be two or more, and supply the same gas as or different gases from each other. For example, the plurality of gas lines 31 may include a first gas line 31a and a second gas line 31b. Here, the process gas may include a substrate processing gas and an inert gas. The first gas line 31a may supply the substrate processing gas, and the second gas line 31b may supply the inert gas. The plurality of gas lines 31 of the gas supply line 30 connected to the first process tube 110a and the plurality of gas lines 31 of the gas supply line 30 connected to the second process tube 110b may be symmetric to each other. The first gas line 31a and the second gas line 31b, which are connected to the first process tube 110a, and the first gas line 31a and the second gas line 31b, which are connected to the second process tube 110b, may be symmetric to each other. For example, when each of the first gas lines 31a is disposed at an outer side in the direction of the first axis 11, the second gas lines 31b may be disposed inner than the first gas lines 31a, respectively, and when each of the second gas lines 31b is disposed at an outer side in the direction of the first axis 11, the first gas lines 31a may be disposed inner than the second gas lines 31b, respectively.

Here, the symmetrically arranged gas lines 31 may be supplied with the same gas as each other. That is, the first gas lines 31a may be supplied with the same gas as each other, and the second gas lines 31b may be supplied with the same gas as each other. Here, the first gas lines 31a and the second gas lines 31b may be supplied with the same gas as or different gases from each other. As the gas lines 31 supplied with the same gas are symmetrically arranged, the gas lines 31 supplying the same gas to the first and second process tubes 110a and 110b, respectively, (i.e., the gas line connected to the first process tube and the gas line connected to the second process tube, which supply the same gas as each other) may have the same length as each other, and thus a temperature difference and a pressure difference of the gas (or the process gas) due to the supply distance difference may be prevented to make the same process conditions for the first and second process tubes 110a and 110b.

As described above, in accordance with an exemplary embodiment, a substrate processing amount may increase through the first and second process tubes providing process spaces independent from each other, and the width of the substrate processing system in the first axial direction may be reduced by arranging the elevation shaft member of each of the first and second boat elevation units in the space between the first and second process tubes, which are spaced apart from each other in the first axial direction. Also, as the elevation shaft members, which are disposed in the space between the first and second process tubes, are point-symmetric to the both sides of the first axis, the space between the first and second process tubes may decrease, and the width of the substrate processing system in the first axial direction may be further reduced. Also, as the elevation shaft member includes the assembly of the ball screw, the plurality of guide rails, and the vertical frame, although the elevation body is coupled to the support plate while being deviated to the second axial direction from the center of the support plate to match the center of the support plate with the center of the process tube, the substrate boat may be stably elevated. Here, the plurality of guide rails may be symmetrically arranged to the both sides of the screw shaft to adjust the balance of the elevation body, and the substrate boat may be stably elevated by the stable elevation of the elevation body. Also, as each of the first and second utility modules extends in a direction away from the corresponding process tube and is deviated from the axis extending in the second axial direction from the center of the corresponding process tube, the maintenance space may be secured between the first and second utility modules, and the width of the substrate processing system in the first axial direction may be minimized when the first and second utility modules extend in the second axial direction. Also, as the cooling water control part, the gas control part, the end of the exhaust duct, and the end of the quick heat dissipation gas line of each of the first and second utility modules are sequentially arranged in a direction away from the respective corresponding process tubes, the maintenance space may further increase, and the width of the substrate processing system in the second axial direction may be reduced. Also, the cooling water supply line and the gas supply line may be minimally affected in temperature from the surroundings. Also, as the plurality of gas lines of the gas supply line connected to the first process tube and the plurality of gas lines of the gas supply line connected to the second process tube are symmetrically arranged, the gas lines supplied with the same gas may have the same length as each other to make the same process condition for each of the process tubes.

Although the substrate processing system has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A substrate processing system comprising:
   first and second process tubes spaced apart from each other and arranged in a first axial direction to provide process spaces independent from each other;
   first and second boat elevation units adjacent to the first and second process tubes, respectively,
   wherein each of the first and second boat elevation units is configured to elevate a substrate boat on which a plurality of substrates are multiply stacked into a corresponding process tube of the first and second process tubes,
   wherein each of the first and second boat elevation units comprises an elevation shaft member disposed in a space between the first and second process tubes and extending toward a corresponding process tube of the first and second process tubes, and
   wherein the elevation shaft member of the first boat elevation unit and the elevation shaft member of the second boat elevation unit are arranged adjacent to each other along a second axial direction crossing the first axial direction, and disposed at opposite sides with respect to a line connecting a center of the first process tube and a center of the second process tube.

2. The substrate processing system of claim 1, wherein the elevation shaft member of the first boat elevation unit and the elevation shaft member of the second boat elevation unit are point-symmetric to each other with respect to a point on the first axis.

3. The substrate processing system of claim 1, wherein each of the first and second boat elevation unit comprises:
   an elevation body connected to the elevation shaft member to elevate along the elevation shaft member; and
   a support plate coupled to the elevation body to support the substrate boat, wherein the elevation body is coupled to the support plate, and is shifted from a center of the support plate in the second axial direction.

4. The substrate processing system of claim 3, wherein the elevation shaft member comprises:
   a ball screw comprising a screw shaft that moves a ball nut through rotation of the screw shaft; and
   a plurality of guide rails symmetrically arranged at two sides of the screw shaft.

5. The substrate processing system of claim 4, wherein the elevation body comprises:
   a base plate coupled to the ball nut, and extending along the screw shaft; and
   a plurality of sliding parts coupled to the base plate at both sides of the ball nut, and configured to slide while being connected to the plurality of guide rails, respectively.

6. The substrate processing system of claim 4, wherein the elevation shaft member further comprises a vertical frame extending along the screw shaft to support the screw shaft and the plurality of guide rails.

7. The substrate processing system of claim 1, further comprising:
   first and second utility modules disposed in correspondence to the first and second process tubes, respectively, and symmetrically arranged by being spaced apart from each other,
   wherein the first and second utility modules provide a maintenance space between each other.

8. The substrate processing system of claim 7, wherein each of the first and second utility modules is offset from a center of the corresponding process tube and extends in a direction away from the corresponding process tube.

9. The substrate processing system of claim 7, wherein each of the first and second utility modules comprises:
   a cooling water control part connected to a cooling water supply line extending from the corresponding process tube and configured to control supply of a cooling water; and
   a gas control part connected to a gas supply line extending from the corresponding process tube and configured to control supply of a process gas,
   wherein, in each of the first and second utility modules, the cooling water control part is disposed closer to the corresponding process tube than the gas control part.

10. The substrate processing system of claim 9, further comprising:
    first and second exhaust ducts connected to the first and second process tubes, respectively, and having ends, wherein each end is connected to a respective exhaust pumping port;
    first and second heater parts provided outside the first and second process tubes, respectively, and configured to supply heat to the first and second process tubes, respectively; and
    first and second quick heat dissipation gas lines configured to cool the first and second heater parts, respectively, and having ends, wherein each end is connected to a respective heat absorption pumping port,
    wherein the end of the exhaust duct provided to the corresponding process tube and the end of the quick heat dissipation gas line configured to cool the heater part configured to supply heat to the corresponding process tube are disposed at each of the first and second utility modules, and
    each end of the first and second exhaust ducts is disposed closer to the corresponding process tube than each end of the first and second quick heat dissipation gas lines.

11. The substrate processing system of claim 9, wherein each of the gas supply lines comprises a plurality of gas lines,
    the plurality of gas lines of the gas supply line connected to the first process tube and the plurality of gas lines of the gas supply line connected to the second process tube are arranged symmetrically to each other, and
    the gas lines supplied with the same gas are symmetrically arranged to each other.

12. The substrate processing system of claim 1, wherein each of the first and second process tubes is provided as a single tube, or as a plurality of tubes.

* * * * *